(12) United States Patent
Park et al.

(10) Patent No.: US 10,777,243 B2
(45) Date of Patent: Sep. 15, 2020

(54) SEMICONDUCTOR DEVICE AND SEMICONDUCTOR SYSTEM INCLUDING THE SEMICONDUCTOR DEVICE FOR ALIGNING AN INTERNAL DATA STROBE SIGNAL USING AN OFFSET CODE

(71) Applicant: SK hynix Inc., Icheon-si Gyeonggi-do (KR)

(72) Inventors: Min Su Park, Seoul (KR); Dong Kyun Kim, Cheongju-si Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/373,345

(22) Filed: Apr. 2, 2019

(65) Prior Publication Data

US 2019/0267058 A1   Aug. 29, 2019

Related U.S. Application Data

(63) Continuation of application No. 16/119,285, filed on Aug. 31, 2018.

(30) Foreign Application Priority Data

Feb. 27, 2018   (KR) .................. 10-2018-0024048

(51) Int. Cl.
*G11C 7/22* (2006.01)
*G11C 7/10* (2006.01)
*G11C 19/28* (2006.01)

(52) U.S. Cl.
CPC ............. *G11C 7/222* (2013.01); *G11C 7/109* (2013.01); *G11C 7/1087* (2013.01); *G11C 19/28* (2013.01)

(58) Field of Classification Search
CPC ....... G11C 7/222; G11C 7/109; G11C 7/1087; G11C 19/28
See application file for complete search history.

(56) References Cited

U.S. PATENT DOCUMENTS 8,243,534 B2   8/2012  Fujisawa
8,565,033 B1   10/2013 Manohararajah et al.
(Continued)

FOREIGN PATENT DOCUMENTS

KR      101585213 B1     1/2016

OTHER PUBLICATIONS

Dongkyun Kim et al., 23.2 A 1.1V 1ynm 6.4Gb/s/pin 16Gb DDR5 SDRAM with a Phase-Rotator-Based DLL, High-Speed SerDes and RX/TX Equalization Scheme, ISSCC 2019/Session 23/DRAM/23. 2, Feb. 17, 2019 to Feb. 21, 2019, pp. 380-381, Icheon, Korea.

*Primary Examiner* — Jerome Leboeuf
(74) *Attorney, Agent, or Firm* — William Park & Associates Ltd.

(57) ABSTRACT

A semiconductor device may include an internal command pulse generation circuit and a sense data generation circuit. The internal command pulse generation circuit may generate an internal command pulse from a write signal based on an offset code and an internal clock signal. The sense data generation circuit may generate sense data from an internal data strobe signal based on the internal command pulse. The internal command pulse may be generated by delaying the write signal by a shift period based on the internal clock signal. The shift period may be controlled by the offset code.

16 Claims, 13 Drawing Sheets

(56) References Cited

U.S. PATENT DOCUMENTS

| | | |
|---|---|---|
| 8,775,761 B2 | 7/2014 | Ok |
| 8,780,655 B1 | 7/2014 | Kumar et al. |
| 8,917,563 B2 | 12/2014 | Miyano et al. |
| 9,106,458 B2 | 8/2015 | Song |
| 9,536,590 B1 | 1/2017 | Zhu et al. |
| 9,881,662 B2 | 1/2018 | Giovannini et al. |
| 9,892,772 B2 | 2/2018 | Song |
| 10,269,443 B2 | 4/2019 | Yu et al. |
| 10,360,951 B1 | 7/2019 | Penney |
| 10,418,125 B1 | 9/2019 | Lin |
| 10,452,319 B1 | 10/2019 | Penney et al. |
| 10,497,413 B1 | 12/2019 | Lin |
| 10,580,465 B2 | 3/2020 | Takefman et al. |
| 10,622,041 B2 | 4/2020 | Kim |
| 2011/0187427 A1* | 8/2011 | Kim .................. H03L 7/06 327/158 |
| 2014/0177359 A1 | 6/2014 | Kumar et al. |
| 2014/0286119 A1* | 9/2014 | Jeon .................. G11C 8/18 365/230.08 |
| 2014/0317470 A1 | 10/2014 | Chung et al. |
| 2014/0321229 A1 | 10/2014 | Duffner |
| 2014/0334243 A1 | 11/2014 | Duffner et al. |
| 2015/0243343 A1 | 8/2015 | Giovannini et al. |
| 2016/0172013 A1 | 6/2016 | Dearth et al. |
| 2019/0244644 A1* | 8/2019 | Komatsu .............. G11C 7/1045 |

* cited by examiner

FIG.7

| OFFSET<4> | OFFSET<3> | OFFSET<2> | OFFSET<1> | SWT |
|---|---|---|---|---|
| L | L | L | H | LWT1 |
| L | L | H | L | LWT2 |
| L | L | H | H | LWT3 |
| ⋮ | ⋮ | ⋮ | ⋮ | ⋮ |
| H | H | H | H | LWT16 |

SEMICONDUCTOR DEVICE AND SEMICONDUCTOR SYSTEM INCLUDING THE SEMICONDUCTOR DEVICE FOR ALIGNING AN INTERNAL DATA STROBE SIGNAL USING AN OFFSET CODE

CROSS-REFERENCE TO RELATED APPLICATIONS

The present application is a continuation application of U.S. patent application Ser. No. 16/119,285, filed on Aug. 31, 2018, and claims priority under 35 U.S.C 119(a) to Korean Application No. 10-2018-0024048, filed on Feb. 27, 2018, which is incorporated herein by references in its entirety.

BACKGROUND

1. Technical Field

Embodiments of the present disclosure generally relate to a semiconductor device, semiconductor system including the semiconductor device, and method of operating the semiconductor device and/or system and, more particularly, to a semiconductor device aligning an internal data strobe signal with a signal based on a write command and semiconductor systems including the semiconductor devices.

2. Related Art

Recently, a semiconductor system has performed a write leveling operation to guarantee that a semiconductor device receives a clock signal and a data strobe signal from a controller at an appropriate time when a write operation is executed to store data into the semiconductor device. The write leveling operation may be performed by the semiconductor device by sensing a phase difference between the clock signal and the data strobe signal which are outputted from the controller and transmitting information on the sensed phase difference to the controller. The controller may delay the data strobe signal on the basis of the information about the phase difference between the clock signal and the data strobe signal and may output the delayed data strobe signal to control a point of time that the clock signal and the delayed data strobe signal arrive at the semiconductor device.

SUMMARY

According to an embodiment, a semiconductor device may include an internal command pulse generation circuit and a sense data generation circuit. The internal command pulse generation circuit may generate an internal command pulse from a write signal based on an offset code and an internal clock signal. The sense data generation circuit may generate sense data from an internal data strobe signal based on the internal command pulse. The internal command pulse may be generated by delaying the write signal by a shift period based on the internal clock signal. The shift period may be controlled by the offset code.

According to an embodiment, a semiconductor device may include an offset code generation circuit configured to generate an offset code based on an internal clock signal and a write signal, an internal command pulse generation circuit configured to generate an internal command pulse from the write signal based on the offset code and the internal clock signal, and a sense data generation circuit configured to generate sense data from an internal data strobe signal based on the internal command pulse. A generation moment of the internal command pulse may be controlled by the offset code.

According to an embodiment, a semiconductor system may include a controller and a semiconductor device. The controller may be configured to output a clock signal, a command, a data strobe signal, and an offset code. The controller may be configured to receive sense data to control the offset code. The semiconductor device may be configured to generate an internal clock signal from the clock signal and generate a write signal from the command. The semiconductor device may be configured to generate an internal data strobe signal from the data strobe signal and generate an internal command pulse from the write signal based on the offset code and the internal clock signal. The semiconductor device may be configured to generate the sense data from the internal data strobe signal based on the internal command pulse.

According to an embodiment, an operating method of a semiconductor system may include setting an initial value of an offset code, by a controller. The method may include generating an internal command pulse by shifting a write signal based on the offset code, by a semiconductor device. The method may include latching an internal data strobe signal based on the internal command pulse to generate sense data, by the semiconductor device. The method may include receiving the sense data and discriminating whether the sense data has a logic high level or a logic low level, by the controller.

BRIEF DESCRIPTION OF THE DRAWINGS

FIG. 7 is a table illustrating an operation of a selection output circuit included in the shift register of FIG. 6.

DETAILED DESCRIPTION

Various embodiments will be described hereinafter with reference to the accompanying drawings. However, the embodiments described herein are for illustrative purposes only and are not intended to limit the scope of the present disclosure.

Figure 1:
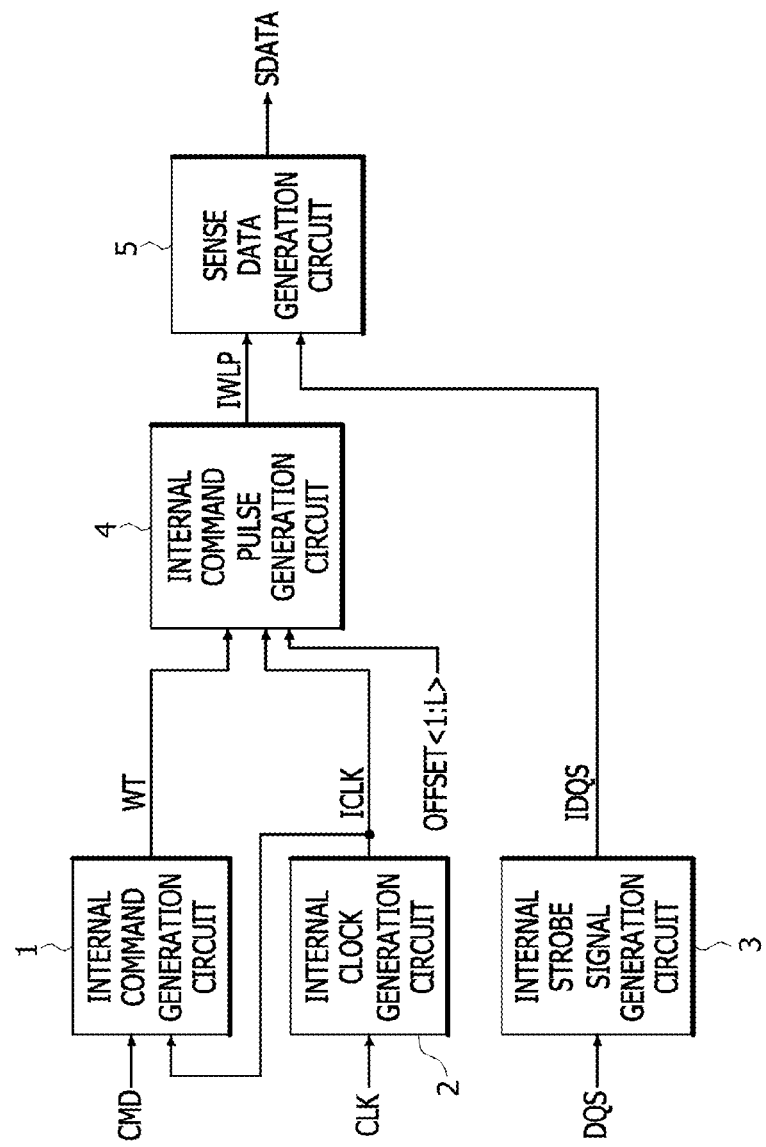
FIG. 1 is a block diagram illustrating a configuration of a semiconductor device in accordance with an embodiment.

As illustrated in FIG. 1, a semiconductor device according to an embodiment may include an internal command generation circuit 1, an internal clock generation circuit 2, an internal strobe signal generation circuit 3, an internal command pulse generation circuit 4, and a sense data generation circuit 5.

The internal command generation circuit 1 may generate a write signal WT from a command CMD in response to an internal clock signal ICLK. The command CMD may be outputted from a controller (61 of FIG. 8). The command CMD may include a plurality of bits. The internal command generation circuit 1 may latch the command CMD according to the internal clock signal ICLK and may decode the latched command to generate the write signal WT. The write signal WT may be enabled to perform a write operation. A configuration and an operation of the internal command generation circuit 1 will be described below with reference to FIG. 2 later.

The internal clock generation circuit 2 may generate the internal clock signal ICLK in response to a clock signal CLK. The internal clock generation circuit 2 may receive the clock signal CLK and may divide a frequency of the clock signal CLK to generate the internal clock signal ICLK. The clock signal CLK may be outputted from the controller (61 of FIG. 8). The internal clock signal ICLK corresponding to a division signal of the clock signal CLK may be generated to have a cycle time which is "N" times a cycle time of the clock signal CLK (where, "N" denotes a natural number). A configuration and an operation of the internal clock generation circuit 2 will be described below with reference to FIG. 3 later.

The internal strobe signal generation circuit 3 may generate an internal data strobe signal IDQS in response to a data strobe signal DQS. The internal strobe signal generation circuit 3 may receive and divide the data strobe signal DQS to generate the internal data strobe signal IDQS. The data strobe signal DQS may be outputted from the controller (61 of FIG. 8). A configuration and an operation of the internal strobe signal generation circuit 3 will be described below with reference to FIG. 4 later.

The internal command pulse generation circuit 4 may shift the write signal WT to generate an internal command pulse IWLP, in response to the internal clock signal ICLK and an offset code OFFSET<1:L>. A period that the write signal WT is shifted according to the internal clock signal ICLK may be controlled by a logic level combination of the offset code OFFSET<1:L>. The number "L" of bits included in the offset code OFFSET<1:L> may be set to be different according to various embodiments. The offset code OFFSET<1:L> may be generated by the controller (61 of FIG. 8). Alternatively, the offset code OFFSET<1:L> may be generated by the semiconductor device. A configuration and an operation of the internal command pulse generation circuit 4 will be described below with reference to FIG. 5 later.

The sense data generation circuit 5 may generate sense data SDATA from the internal data strobe signal IDQS in response to the internal command pulse IWLP. The sense data generation circuit 5 may latch the internal data strobe signal IDQS to output the latched internal data strobe signal as the sense data SDATA at a point of time that the internal command pulse IWLP is created. The sense data SDATA may be outputted from the semiconductor device through a data pad (625 of FIG. 8).

Figure 2:
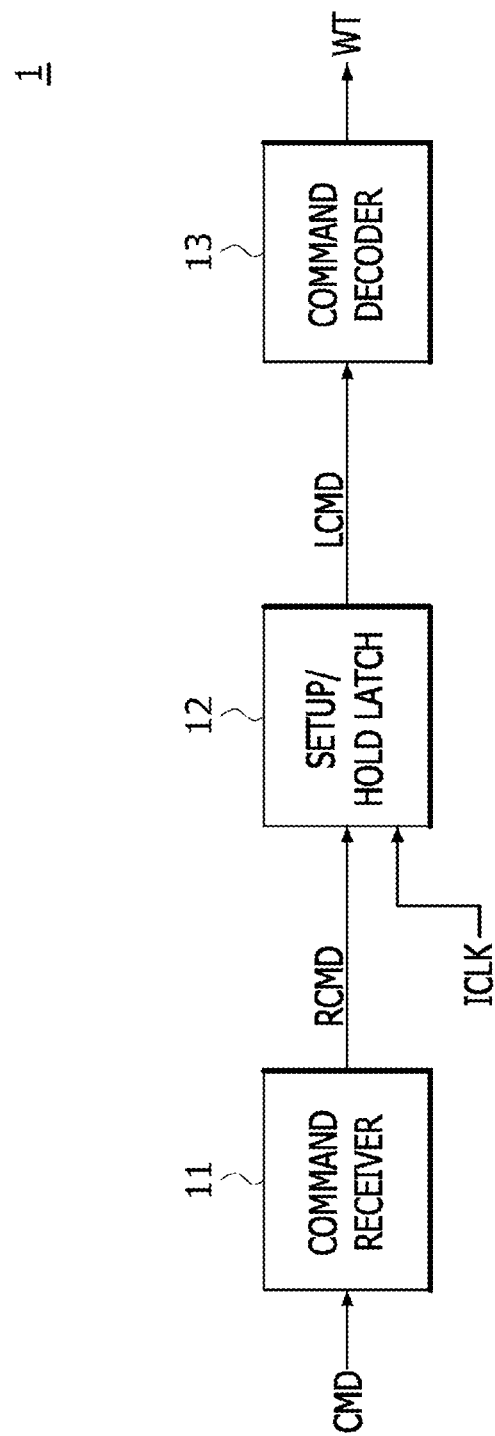
FIG. 2 is a block diagram illustrating a configuration of an example of an internal command generation circuit included in the semiconductor device of FIG. 1.

Referring to FIG. 2, the internal command generation circuit 1 may include a command receiver 11, a setup/hold latch 12 and a command decoder 13. The command receiver 11 may receive the command CMD to generate a receipt command RCMD. The command receiver 11 may be realized using a buffering circuit (not illustrated) and may buffer the command CMD to generate the receipt command RCMD. The setup/hold latch 12 may generate a latched command LCMD from the receipt command RCMD in response to the internal clock signal ICLK. The setup/hold latch 12 may be realized using a latch circuit (not illustrated) and may latch the receipt command RCMD in synchronization with the internal clock signal ICLK to output the latched receipt command as the latched command LCMD. The command decoder 13 may decode the latched command LCMD to generate the write signal WT. The latched command LCMD may include a plurality of bits. The command decoder 13 may generate the write signal WT which is enabled if a logic level combination of the bits included in the latched command LCMD is consistent with a predetermined logic level combination. A logic level combination of the bits included in the latched command LCMD for enabling the write signal WT may be set to be different according to various embodiments.

Figure 3:
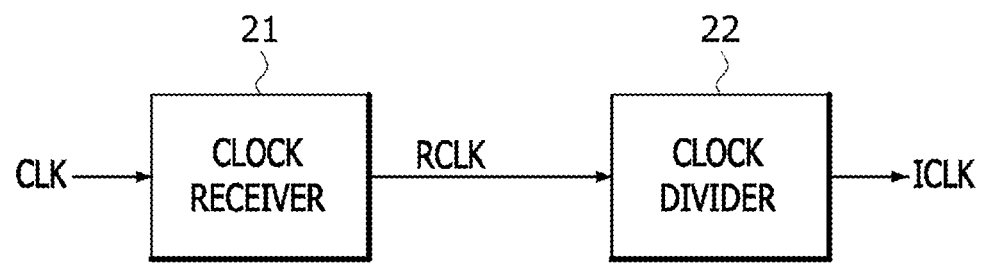
FIG. 3 is a block diagram illustrating a configuration of an example of an internal clock generation circuit included in the semiconductor device of FIG. 1.

Referring to FIG. 3, the internal clock generation circuit 2 may include a clock receiver 21 and a clock divider 22. The clock receiver 21 may receive the clock signal CLK to generate a receipt clock signal RCLK. The clock receiver 21 may be realized using a buffering circuit (not illustrated) and may buffer the clock signal CLK to generate the receipt clock signal RCLK. The clock divider 22 may be realized using a dividing circuit (not illustrated) and may divide a frequency of the receipt clock signal RCLK to generate the internal clock signal ICLK. The internal clock signal ICLK may be generated to have a cycle time which is "N" times a cycle time of the receipt clock signal RCLK (where, "N" denotes a natural number).

Figure 4:
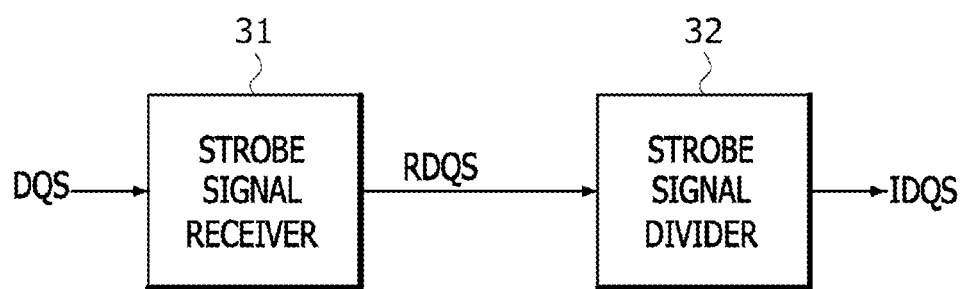
FIG. 4 is a block diagram illustrating a configuration of an example of an internal strobe signal generation circuit included in the semiconductor device of FIG. 1.

Referring to FIG. 4, the internal strobe signal generation circuit 3 may include a strobe signal receiver 31 and a strobe signal divider 32. The strobe signal receiver 31 may receive the data strobe signal DQS to generate a receipt data strobe signal RDQS. The strobe signal receiver 31 may be realized using a buffering circuit (not illustrated) and may buffer the data strobe signal DQS to generate the receipt data strobe signal RDQS. The strobe signal divider 32 may be realized using a dividing circuit (not illustrated) and may divide a frequency of the receipt data strobe signal RDQS to generate the internal data strobe signal IDQS. The internal data strobe signal IDQS may be generated to have a cycle time which is "N" times a cycle time of the receipt data strobe signal RDQS (where, "N" denotes a natural number).

Figure 5:
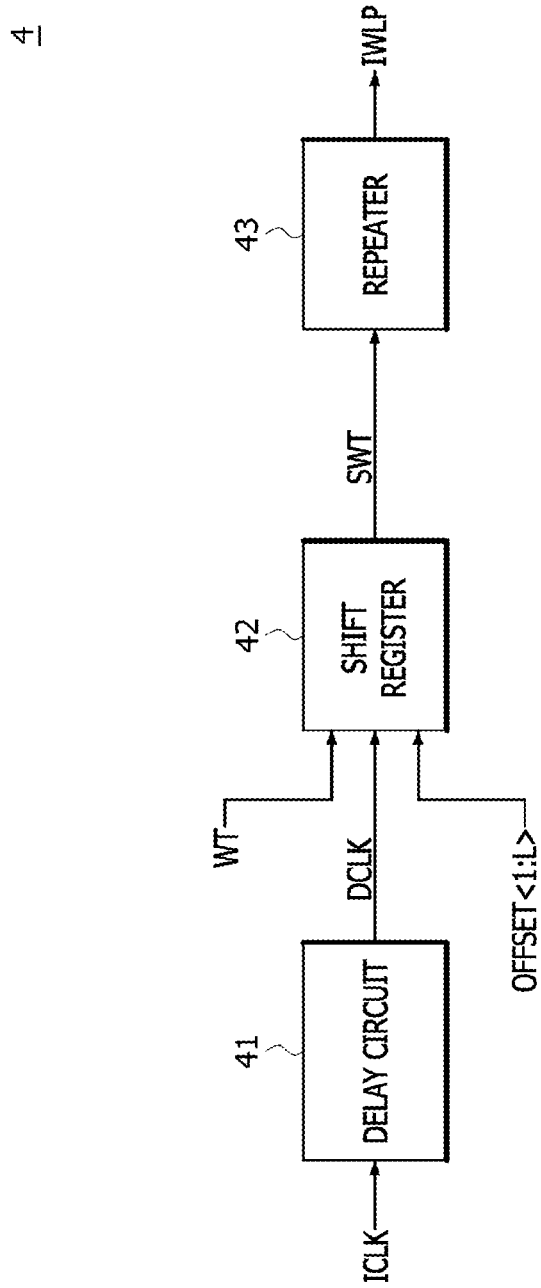
FIG. 5 is a block diagram illustrating a configuration of an example of an internal command pulse generation circuit included in the semiconductor device of FIG. 1.

Referring to FIG. 5, the internal command pulse generation circuit 4 may include a delay circuit 41, a shift register 42, and a repeater 43. The delay circuit 41 may delay the internal clock signal ICLK to generate a delayed clock signal DCLK. The delay circuit 41 may be realized using an inverter chain or the like. The shift register 42 may shift the write signal WT to generate a shifted write signal SWT, in response to the delayed clock signal DCLK and the offset code OFFSET<1:L>. A period (e.g., a shift period) that the write signal WT is shifted according to the delayed clock signal DCLK may be controlled by a logic level combination of the offset code OFFSET<1:L>. The repeater 43 may amplify the shifted write signal SWT to generate the internal command pulse IWLP.

Figure 6:
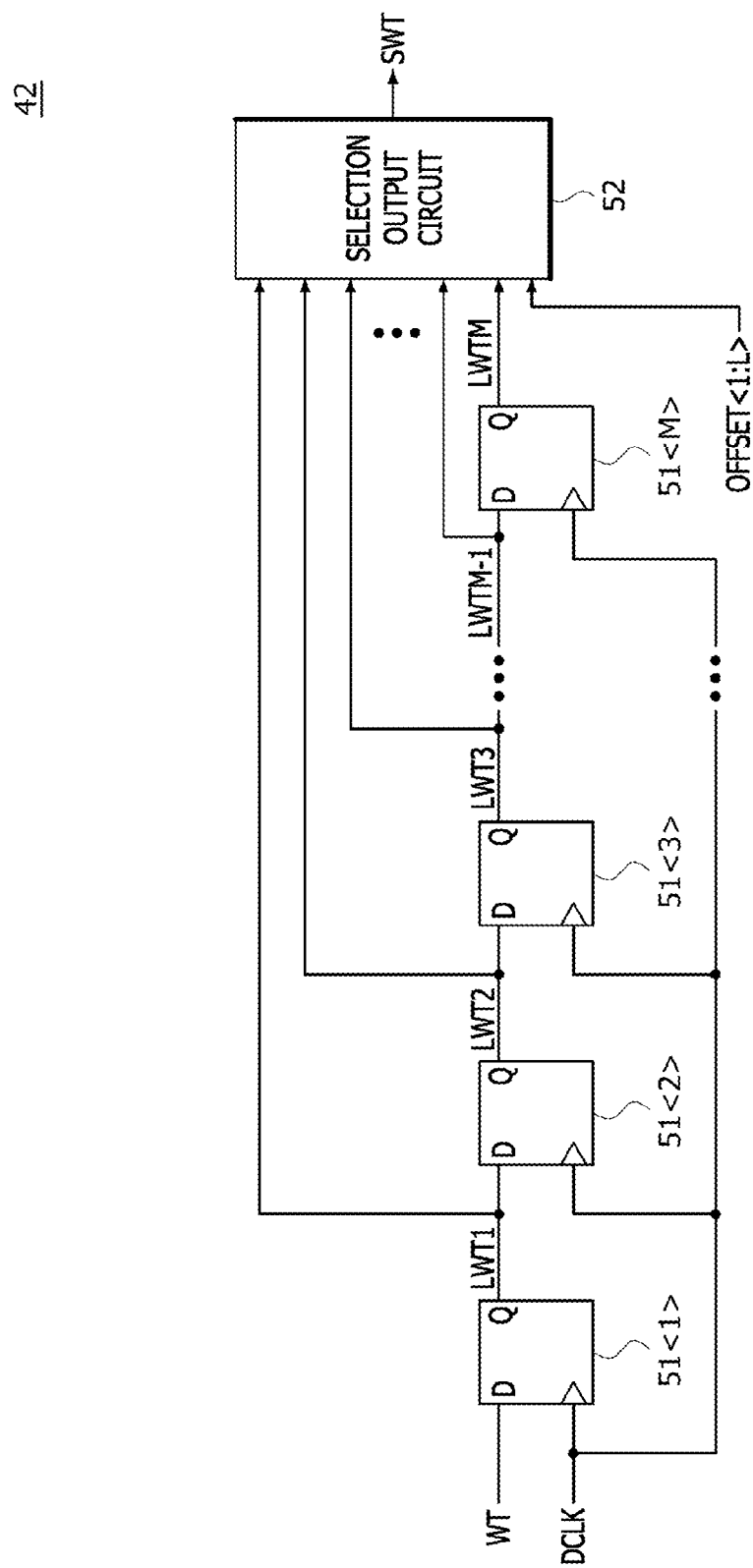
FIG. 6 is a block diagram illustrating a configuration of an example of a shift register included in the internal command pulse generation circuit of FIG. 5.

Referring to FIG. 6, the shift register 42 may include first to M$^{th}$ flip-flops 51<1:M> and a selection output circuit 52. The first flip-flop 51<1> may be synchronized with a rising edge of the delayed clock signal DCLK to latch the write signal WT and may output the latched write signal as a first latched write signal LWT1. The second flip-flop 51<2> may be synchronized with a rising edge of the delayed clock signal DCLK to latch the first latched write signal LWT1 and may output the latched signal as a second latched write signal LWT2. The third flip-flop 51<3> may be synchronized with a rising edge of the delayed clock signal DCLK to latch the second latched write signal LWT2 and may output the latched signal as a third latched write signal LWT3. The M$^{th}$ flip-flop 51<M> may be synchronized with a rising edge of the delayed clock signal DCLK to latch the (M−1)$^{th}$ latched write signal LWTM-1 and may output the latched signal as an M$^{th}$ latched write signal LWTM. The selection output circuit 52 may select any one of the first to M$^{th}$ latched write signals LWT1~LWTM according to a logic level combination of the offset code OFFSET<1:L> and may output the selected signal as the shifted write signal SWT.

Referring to FIG. 7, various latched write signals selected as the shifted write signal SWT are listed according to various logic level combinations of the offset code OFFSET<1:4> having four bits. If the offset code OFFSET<1:4> has a logic level combination of 'L,L,L,H', the first latched write signal LWT1 may be selected and outputted as the shifted write signal SWT. In the offset code OFFSET<1:4>, the logic level combination of 'L,L,L,H' means that only the first bit (OFFSET<1>) of the offset code OFFSET<1:4> has a logic "high" level and all of the second to fourth bits (OFFSET<2:4>, i.e., OFFSET<2>, OFFSET<3>, and OFFSET<4>) of the offset code OFFSET<1:4> have a logic "low" level. If the offset code OFFSET<1:4> has a logic level combination of 'L,L,H,L', the second latched write signal LWT2 may be selected and outputted as the shifted write signal SWT. In the offset code OFFSET<1:4>, the logic level combination of 'L,L,H,L' means that only the second bit (OFFSET<2>) of the offset code OFFSET<1:4> has a logic "high" level and all of the first, third, and fourth bits (OFFSET<1> and OFFSET<3:4>) of the offset code OFFSET<1:4> have a logic "low" level. If the offset code OFFSET<1:4> has a logic level combination of 'L,L,H,H', the third latched write signal LWT3 may be selected and outputted as the shifted write signal SWT. In the offset code OFFSET<1:4>, the logic level combination of 'L,L,H,H' means that the first and second bits (OFFSET<1:2>) of the offset code OFFSET<1:4> have a logic "high" level and the third and fourth bits (OFFSET<3:4>) of the offset code OFFSET<1:4> have a logic "low" level. If the offset code OFFSET<1:4> has a logic level combination of 'H,H,H,H', the sixteenth latched write signal LWT16 may be selected and outputted as the shifted write signal SWT. In the offset code OFFSET<1:4>, the logic level combination of 'H,H,H,H' means that all of the bits of the offset code OFFSET<1:4> have a logic "high" level.

Figure 8:
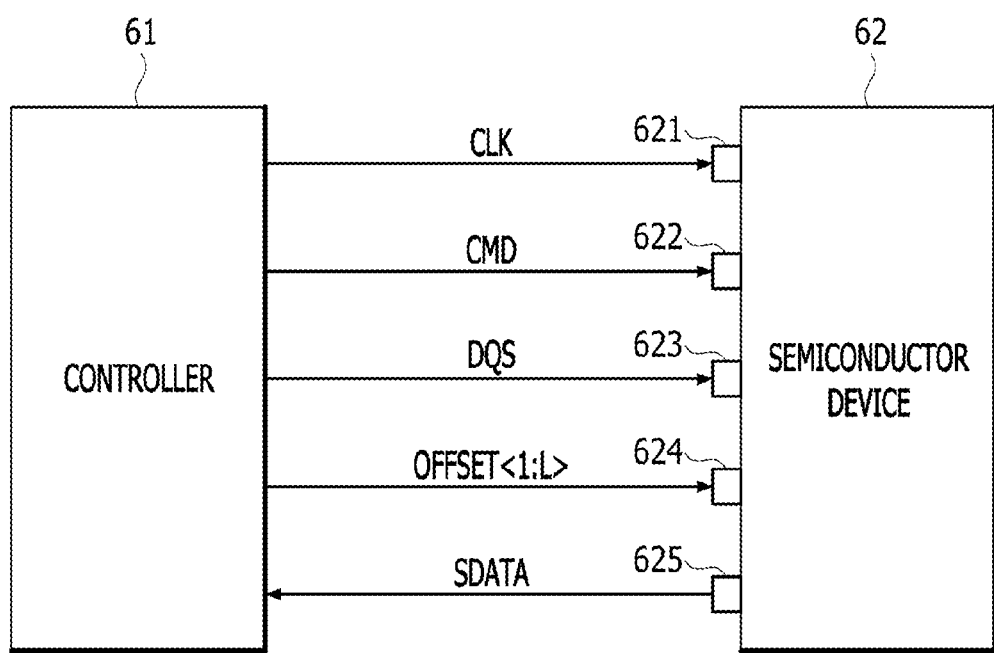
FIG. 8 is a block diagram illustrating a configuration of an example of a semiconductor system employing the semiconductor device illustrated in FIGS. 1 to 7.

Referring to FIG. 8, a semiconductor system according to an embodiment may include a controller 61 and a semiconductor device 62. The semiconductor device 62 may correspond to the semiconductor device described with reference to FIGS. 1 to 7.

The controller 61 may apply a clock signal CLK, a command CMD, a data strobe signal DQS and an offset code OFFSET<1:L> to the semiconductor device 62. The controller 61 may receive sense data SDATA from the semiconductor device 62 to control the offset code OFFSET<1:L>. The controller 61 may count up or down the offset code OFFSET<1:L> until the sense data SDATA having a predetermined logic level (e.g., a logic "high" level) is inputted to the controller 61 and may apply the counted offset code OFFSET<1:L> to the semiconductor device 62. If the offset code OFFSET<1:L> is counted up, a period that a signal (e.g., a write signal) is shifted by the offset code OFFSET<1:L> may increase. In contrast, if the offset code OFFSET<1:L> is counted down, a period that a signal (e.g., a write signal) is shifted by the offset code OFFSET<1:L> may be reduced. In the event that the offset code OFFSET<1:2> is counted up, the offset code OFFSET<1:2> may be counted up to have a logic level combination of '00', '01', '10' and '11' in sequence. In the event that the offset code OFFSET<1:2> is counted down, the offset code OFFSET<1:2> may be counted down to have a logic level combination of '11', '10', '01' and '00' in sequence. In the offset code OFFSET<1:2>, the logic level combination of '01' means that the first bit (OFFSET<1>) of the offset code OFFSET<1:2> has a logic "high" level and the second bit (OFFSET<2>) of the offset code OFFSET<1:2> has a logic "low" level.

The semiconductor device 62 may receive the clock signal CLK, the command CMD, the data strobe signal DQS, and the offset code OFFSET<1:L> to generate the sense data SDATA. The semiconductor device 62 may receive the clock signal CLK through a pad 621, may receive the command CMD through a pad 622, may receive the data strobe signal DQS through a pad 623, and may receive the offset code OFFSET<1:L> through a pad 624. The semiconductor device 62 may output the sense data SDATA through a pad 625. The semiconductor device 62 for generating the sense data SDATA may be realized to have substantially the same configuration and operation as the semiconductor device described with reference to FIGS. 1 to 7. The semiconductor device 62 may apply the sense data SDATA to the controller 61.

Figure 9:
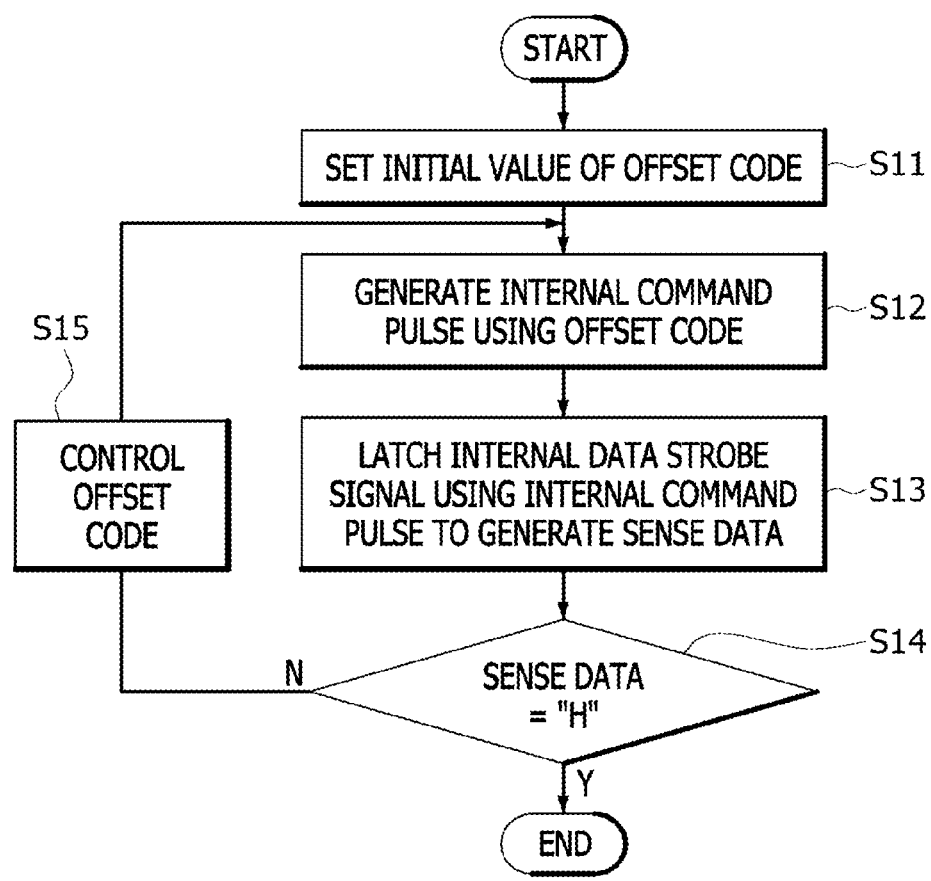
FIG. 9 is a flowchart illustrating an operation for setting an offset code in the semiconductor system illustrated in FIG. 8.

An operation for generating the offset code OFFSET<1:L> in the semiconductor system having the aforementioned configuration will be described hereinafter with reference to FIG. 9.

First, the controller 61 may set an initial value of the offset code OFFSET<1:L> which is applied to the semiconductor device 62 (see step S11). For example, the initial value of the offset code OFFSET<1:L> may be set such that all of the bits of the offset code OFFSET<1:L> have a logic "low" level. The initial value of the offset code OFFSET<1:L> may be set to be different according to various embodiments.

Next, the semiconductor device 62 may shift the write signal WT by a shift period controlled by the offset code OFFSET<1:L> to generate the internal command pulse IWLP (see step S12).

Subsequently, the semiconductor device 62 may latch the internal data strobe signal IDQS to generate the sense data SDATA, in response to the internal command pulse IWLP (see step S13). More specifically, the semiconductor device 62 may latch the internal data strobe signal IDQS to output the latched internal data strobe signal as the sense data SDATA at a point of time that the internal command pulse IWLP is created.

Next, the controller 61 may receive the sense data SDATA to discriminate whether the sense data SDATA has a logic "high" level (see step S14). If the sense data SDATA has a logic "low" level, the controller 61 may control the offset code OFFSET<1:L> (see step S15). For example, if the sense data SDATA has a logic "low" level, the controller 61 may count up the offset code OFFSET<1:L>. After the offset code OFFSET<1:L> is controlled at step S15, step S12 of generating the internal command pulse IWLP, step S13 of generating the sense data SDATA, and step S14 of discriminating the sense data SDATA may be sequentially performed. If the sense data SDATA has a logic "high" level, the semiconductor system may terminate the operation of setting the offset code OFFSET<1:L>. In an embodiment, for example, if the sense SDATA has a logic "low" level, the controller 61 may count down the offset code OFFSET<1:L> (see step S15).

Figure 10:
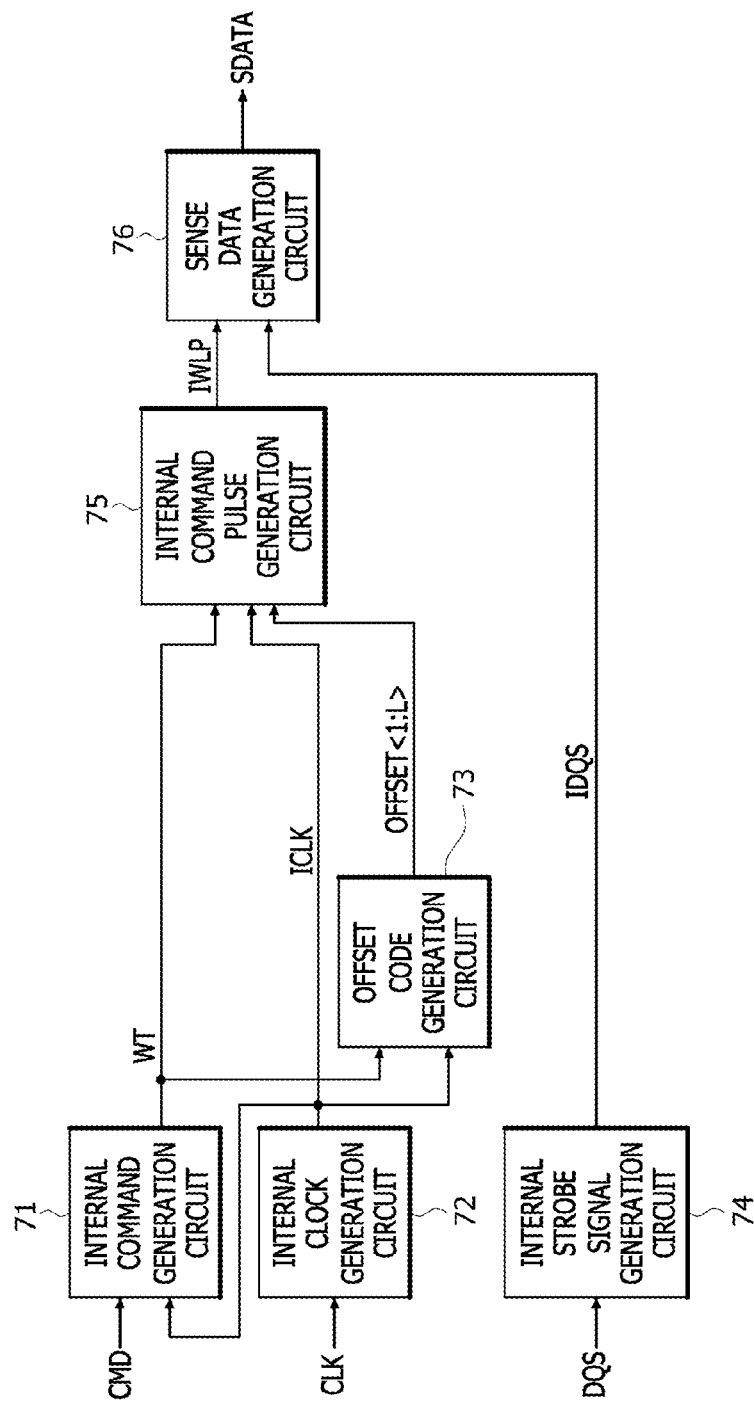
FIG. 10 is a block diagram illustrating a configuration of a semiconductor device in accordance with other embodiments.

Referring to FIG. 10, a semiconductor device according to other embodiments may include an internal command generation circuit 71, an internal clock generation circuit 72, an offset code generation circuit 73, an internal strobe signal generation circuit 74, an internal command pulse generation circuit 75, and a sense data generation circuit 76.

The internal command generation circuit 71 may generate a write signal WT from a command CMD in response to an internal clock signal ICLK. The command CMD may include a plurality of bits. The internal command generation circuit 71 may latch the command CMD according to the internal clock signal ICLK and may decode the latched command to generate the write signal WT. The write signal WT may be enabled to perform a write operation.

The internal clock generation circuit 72 may generate the internal clock signal ICLK in response to a clock signal CLK. The internal clock generation circuit 72 may receive the clock signal CLK and may divide a frequency of the clock signal CLK to generate the internal clock signal ICLK. The internal clock signal ICLK corresponding to a division signal of the clock signal CLK may be generated to have a cycle time which is "N" times a cycle time of the clock signal CLK (where, "N" denotes a natural number).

The offset code generation circuit 73 may generate an offset code OFFSET<1:L> in response to the internal clock signal ICLK. The offset code generation circuit 73 may generate the offset code OFFSET<1:L> that is counted by the internal clock signal ICLK which is sampled during a predetermined period from a point of time that the write signal WT is generated. A configuration and an operation of the offset code generation circuit 73 will be described below with reference to FIGS. 11 and 12 later.

The internal strobe signal generation circuit 74 may generate an internal data strobe signal IDQS in response to a data strobe signal DQS. The internal strobe signal generation circuit 74 may receive and divide the data strobe signal DQS to generate the internal data strobe signal IDQS.

The internal command pulse generation circuit 75 may shift the write signal WT to generate an internal command pulse IWLP, in response to the internal clock signal ICLK and the offset code OFFSET<1:L>. A period that the write signal WT is shifted according to the internal clock signal ICLK may be controlled by a logic level combination of the offset code OFFSET<1:L>. The number "L" of bits included in the offset code OFFSET<1:L> may be set to be different according to various embodiments.

The sense data generation circuit 76 may generate sense data SDATA from the internal data strobe signal IDQS in response to the internal command pulse IWLP. The sense data generation circuit 76 may latch the internal data strobe signal IDQS to output the latched internal data strobe signal as the sense data SDATA at a point of time that the internal command pulse IWLP is created.

Figure 11:
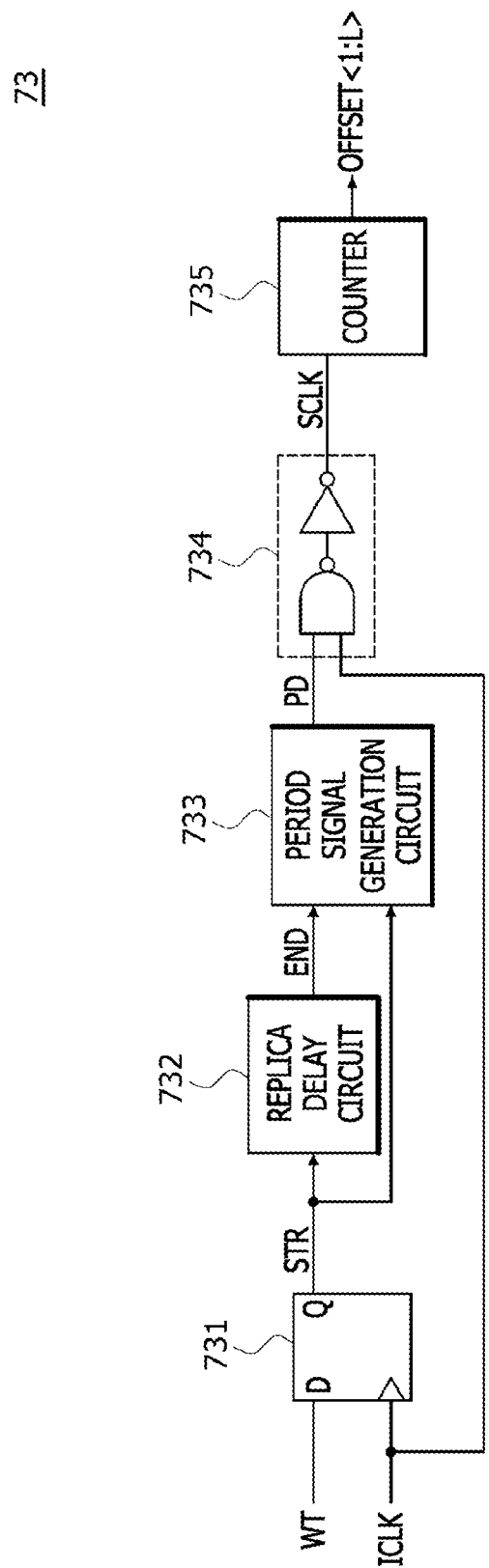
FIG. 11 is a block diagram illustrating a configuration of an example of an offset code generation circuit included in the semiconductor device of FIG. 10.

Referring to FIG. 11, the offset code generation circuit 73 may include a start signal generation circuit 731, a replica delay circuit 732, a period signal generation circuit 733, a selection clock generation circuit 734, and a counter 735.

The start signal generation circuit 731 may generate a start signal STR from the write signal WT in response to the internal clock signal ICLK. The start signal generation circuit 731 may latch the write signal WT in synchronization with the internal clock signal ICLK to generate the start signal STR. The start signal generation circuit 731 may generate the start signal STR if the write signal WT is generated in synchronization with a rising edge of the internal clock signal ICLK. The start signal generation circuit 731 may be realized using a flip-flop.

The replica delay circuit 732 may delay the start signal STR by a predetermined delay period to generate an end signal END. The predetermined delay period set by the replica delay circuit 732 may include a timing difference between the internal clock signal ICLK and the internal data strobe signal IDQS. The predetermined delay period may be set to be different according to various embodiments.

The period signal generation circuit 733 may generate a period signal PD in response to the start signal STR and the end signal END. The period signal generation circuit 733 may generate the period signal PD which is enabled at a point of time that the start signal STR is generated. The period signal generation circuit 733 may generate the period signal PD which is disabled at a point of time that the end signal END is generated.

The selection clock generation circuit 734 may generate a selection clock signal SCLK from the internal clock signal ICLK in response to the period signal PD. The selection clock generation circuit 734 may output the internal clock signal ICLK as the selection clock signal SCLK while the period signal PD is enabled.

The counter 735 may generate the offset code OFFSET<1:L> in response to the selection clock signal SCLK. The counter 735 may count the offset code OFFSET<1:L> whenever the selection clock signal SCLK is toggled. For example, the counter 735 may be synchronized with a rising edge of the selection clock signal SCLK to count up or down the offset code OFFSET<1:L>.

An operation of the offset code generation circuit 73 will be described hereinafter with reference to FIG. 12.

Figure 12:
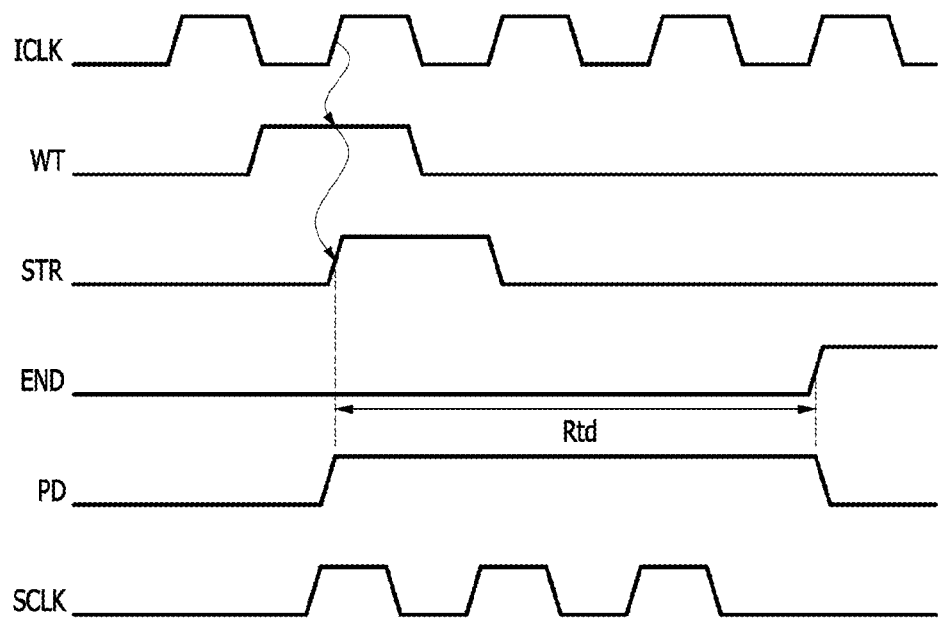
FIG. 12 is a timing diagram illustrating an operation of the offset code generation circuit illustrated in FIG. 11.

Referring to FIG. 12, the write signal WT may be latched in synchronization with a rising edge of the internal clock signal ICLK to generate the start signal STR. The end signal END may be generated at a point of time that a predetermined delay period Rtd set by the replica delay circuit 732 elapses from a point of time that the start signal STR is generated. The period signal PD may be enabled during a period from a point of time that the start signal STR is generated till a point of time that the end signal END is generated.

The internal clock signal ICLK may be sampled while the period signal PD is enabled to have a logic "high" level and the sampled internal clock signal may be outputted as the selection clock signal SCLK. The selection clock signal SCLK may be used to count the offset code OFFSET<1: L>.

Figure 13:
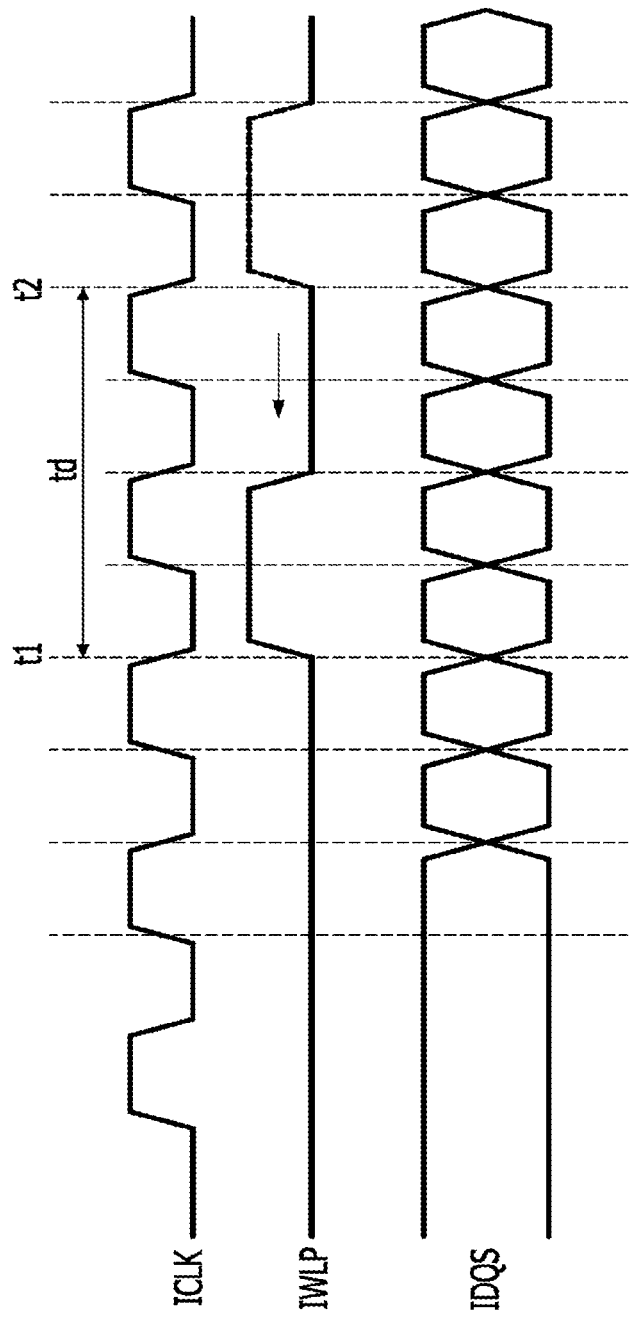
FIG. 13 is a timing diagram illustrating an operation of the semiconductor device illustrated in FIG. 10.

Referring to FIG. 13, waveforms of the internal clock signal ICLK, the internal command pulse IWLP, and the internal data strobe signal IDQS are illustrated. In the event that the internal data strobe signal IDQS is set to be stably generated at a point of time "t1", the internal command pulse IWLP also has to be generated at the point of time "t1". As illustrated in FIG. 13, if the internal command pulse IWLP created in synchronization with the internal clock signal ICLK is generated at a point of time "t2" that a delay period td elapses from the point of time "t1", the semiconductor device according to an embodiment may reduce a shift period controlled by the offset code OFFSET<1:L> to change a generation moment of the internal command pulse IWLP from the point of time "t2" into the point of time "t1". Although an embodiment illustrates an example in which the internal data strobe signal IDQS is stably generated at a point of time that the internal data strobe signal IDQS is thirdly toggled, the present disclosure is not limited thereto. That is, a point of time that the internal data strobe signal IDQS is stably generated may be set to be different according to various embodiments. The semiconductor device according to an embodiment may control a generation moment of the internal command pulse IWLP using the offset code OFFSET<1:L>. Thus, even though a generation timing of the internal data strobe signal IDQS changes, the internal data strobe signal IDQS may be synchronized and stably aligned with the internal command pulse IWLP.

According to various embodiments described above, a write signal may be shifted to generate an internal command pulse for aligning an internal data strobe signal. Thus, even though a generation timing of the internal data strobe signal changes, the internal data strobe signal may be stably aligned with the internal command pulse by controlling a shift period of the write signal using an offset code.

What is claimed is:

1. A semiconductor memory device comprising:
   an internal command pulse generation circuit configured to generate an internal command pulse from:
      an offset code; and
      a write signal, which is generated from a command received from a controller coupled to said semiconductor memory device, and from an internal clock signal;
   a sense data generation circuit coupled to the internal command pulse generation circuit and receiving said internal command pulse, the sense data generation circuit being configured to:
      1) generate a sense data from an internal data strobe signal, which is generated within the semiconductor memory device; and
      2) provide said sense data signal to said controller;
   an internal strobe signal generation circuit coupled to the sense data generation circuit and which is configured to generate said internal data strobe signal, the internal strobe generation circuit comprising a strobe signal divider, which is configured to receive a data strobe signal from said controller and generate the internal strobe signal by dividing a frequency of the data strobe signal by a predetermined value;
   wherein the offset code has a value determined by the sense data provided to said controller.

2. The semiconductor device of claim 1, wherein internal command pulse generation circuit shifts the write signal by a shift period based on the code to generate the internal command pulse, wherein the shift period is controlled by the code.

3. The semiconductor device of claim 1, further comprising a code generation circuit configured to generate the code, wherein a logic level combination of bits included in the code is controlled by a logic level of the sense data.

4. The semiconductor device of claim 1, wherein the sense data generation circuit is configured to latch the internal data strobe signal based on the internal command pulse and configured to output the latched internal data strobe signal as the sense data.

5. The semiconductor device of claim 4, wherein the sense data comprises information about a phase of the internal data strobe signal when the internal command pulse is generated.

6. The semiconductor device of claim 1, wherein the internal data strobe signal is generated by buffering a data strobe signal.

7. A semiconductor system comprising:
   a semiconductor memory device configured to generate an internal command pulse from a write signal based on a code, and generate sense data from an internal data strobe signal based on the internal command pulse, the semiconductor memory device comprising:
      an internal command pulse generation circuit configured to generate the internal command pulse from:
         an offset code, and
         a write signal, which is generated from a command received from said controller and from an internal clock signal, which is generated by said semiconductor memory device from a clock signal;
      a sense data generation circuit coupled to the internal command pulse generation circuit and receiving said internal command pulse, the sense data generation circuit being configured to generate the sense data from an internal data strobe signal, which is generated within the semiconductor memory device, and to provide said sense data to said controller; and
      an internal strobe signal generation circuit coupled to the sense data generation circuit and configured to generate said internal data strobe signal, the internal strobe generation circuit comprising a strobe signal divider, which is configured to receive a data strobe signal from said controller and generate the internal strobe signal by dividing a frequency of the data strobe signal by a predetermined value;
      wherein the offset code has a value determined is controlled by the sense data provided to said controller;
   the semiconductor system additionally comprising:
   a controller coupled to the semiconductor memory device, the controller being configured to receive the sense data and to output the internal data strobe signal, wherein the code is controlled by the sense data.

8. The semiconductor system of claim 7, wherein the semiconductor device shifts the write signal by a shift period based on the code to generate the internal command pulse, wherein the shift period is controlled by the code.

9. The semiconductor system of claim 7, wherein the semiconductor device comprises a code generation circuit configured to generate the code, wherein a logic level combination of bits included in the code is controlled by a logic level of the sense data.

10. The semiconductor system of claim 7, wherein the semiconductor device is configured to latch the internal data strobe signal based on the internal command pulse and configured to output the latched internal data strobe signal as the sense data.

11. The semiconductor system of claim 7, wherein the sense data comprises information about a phase of the internal data strobe signal when the internal command pulse is generated.

12. The semiconductor system of claim 7, wherein the internal data strobe signal is generated by buffering a data strobe signal.

13. The semiconductor device of claim 1, wherein the code has a first value and wherein the sense data has a second and different value, wherein the value of the code received by the semiconductor device changes until the sense data equals a predetermined value.

14. The semiconductor device of claim 1, wherein the semiconductor device is configured to store data responsive to the write signal.

15. The semiconductor system of claim 7, wherein the controller is configured to provide the code to the semiconductor device and wherein the controller is additionally configured to change the value of the code provided to the semiconductor device responsive to the value of the sense data, until the value of the sense data received by the controller from the semiconductor device is equal to a predetermined value.

16. The semiconductor device of claim 7, wherein the semiconductor device is configured to generate the write signal from a command provided to the semiconductor device by the controller.

\* \* \* \* \*